United States Patent
Chen et al.

(10) Patent No.: US 7,917,886 B2
(45) Date of Patent: Mar. 29, 2011

(54) AUTOMATIC SYSTEM AND METHOD FOR PROVIDING PCB LAYOUT

(75) Inventors: Yung-Chieh Chen, Taipei Hsien (TW); Shen-Chun Li, Taipei Hsien (TW); Hsien-Chuan Liang, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 161 days.

(21) Appl. No.: 12/436,764

(22) Filed: May 6, 2009

(65) Prior Publication Data

US 2010/0257504 A1    Oct. 7, 2010

(30) Foreign Application Priority Data

Apr. 7, 2009    (CN) .......................... 2009 1 0301377

(51) Int. Cl.
G06F 17/50    (2006.01)

(52) U.S. Cl. ........ 716/137; 716/100; 716/101; 716/126; 716/129; 716/130; 716/138

(58) Field of Classification Search .................. 716/100, 716/101, 126, 129, 130, 137, 138
See application file for complete search history.

(56) References Cited

U.S. PATENT DOCUMENTS

| 6,829,749 | B2 * | 12/2004 | Osaka et al. .................. 716/102 |
| 7,409,667 | B1 * | 8/2008 | Pritchard et al. .............. 716/102 |
| 7,434,190 | B2 * | 10/2008 | Inoue et al. ................... 716/137 |

* cited by examiner

Primary Examiner — Nghia M Doan
(74) Attorney, Agent, or Firm — Zhigang Ma

(57) ABSTRACT

An automatic system for providing printed circuit board (PCB) layout of a PCB includes an input device, a data processing device, and a storage device. The data processing device includes an invoking module, a calculating module, and a determining module. The invoking module is to read a name and a thickness of each layer of the PCB from the storage device. The calculating module is to calculate an actual length of a via stub of each layer according to the name and thickness of each layer, and calculate an ideal length of the via stub of the PCB according to input information from the input device, and a preset formula. The determining module is to compare the ideal length and the actual length of the via stub of each layer to determine whether the layer can be used as a high-speed signal layout layer or not.

11 Claims, 3 Drawing Sheets

AUTOMATIC SYSTEM AND METHOD FOR PROVIDING PCB LAYOUT

BACKGROUND

1. Technical Field

The present disclosure relates to automatic systems and methods for providing printed circuit board (PCB) layout, and particularly to an automatic system and a method for providing PCB layout for high-speed signals.

2. Description of Related Art

Sizes of PCBs and chips mounted on the PCBs are continuing to be miniaturized, while frequencies of electronic signals transmitted on the PCBs are being increased. Thus, high-speed or high-frequency signals transmitted between chips via traces and holes on a PCB are liable to generate unwanted reflections. The high-speed or high-frequency signals may also be prone to cross-talk and electromagnetic interference. To eliminate interference, technicians may often manually calculate values of the interference of each layer of the PCB and choose a layout layer for high-speed signals having the least interference. However, if lots of high-speed signals are to be provided with a layout layer, manually dealing with the layout layer may become too difficult for the technicians, which makes PCB layout inaccurate and inefficient.

DETAILED DESCRIPTION

Figure 1:
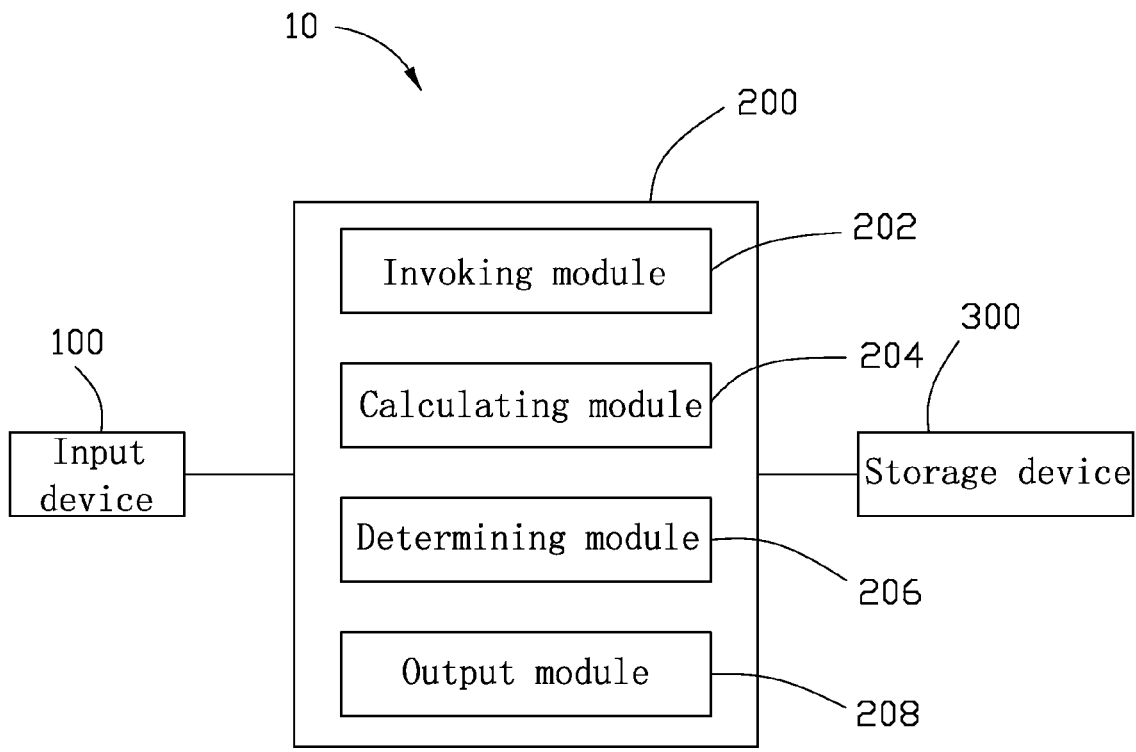
FIG. 1 is a block diagram of an exemplary embodiment of an automatic system for providing PCB layout.
Figure 2:
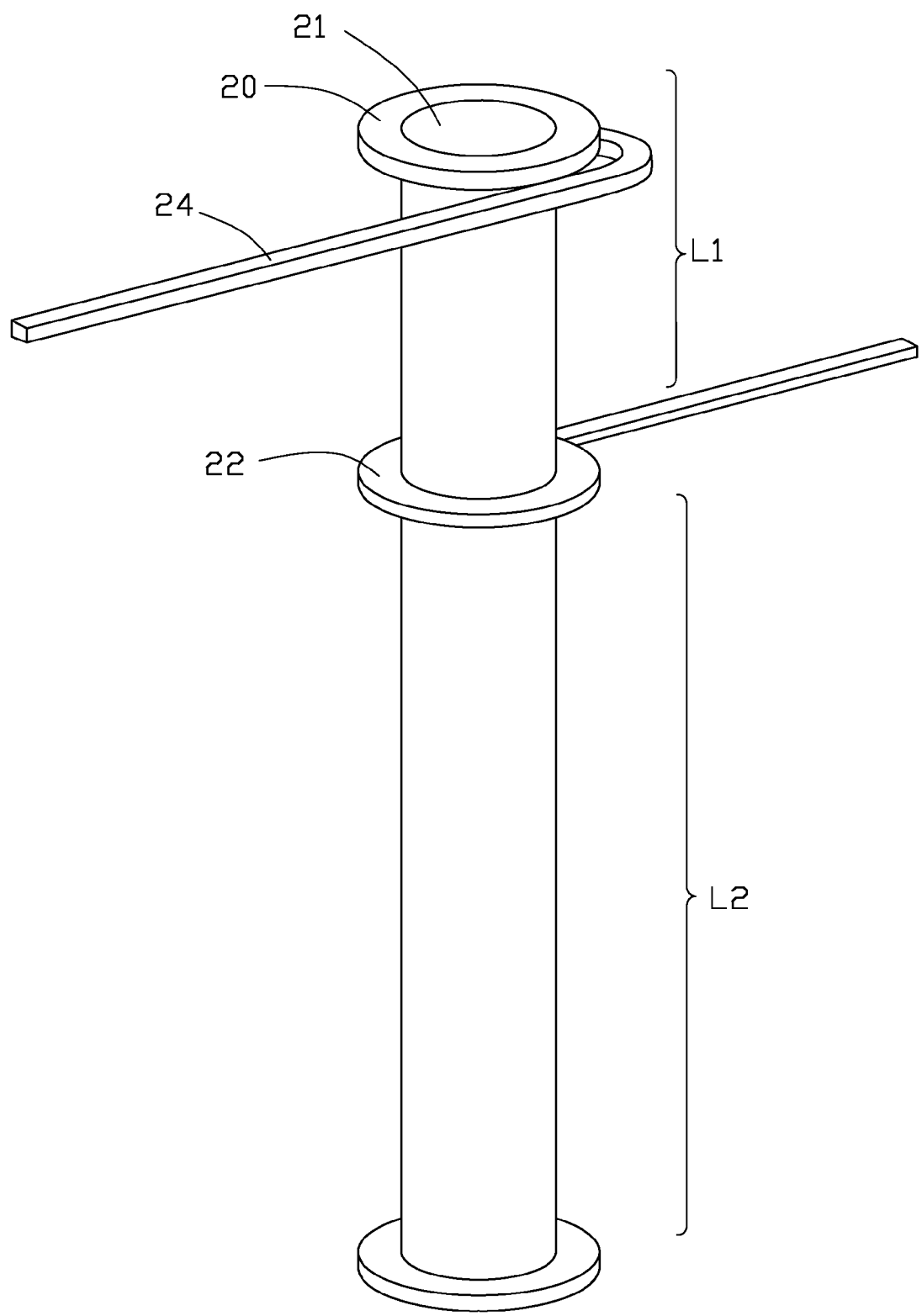
FIG. 2 is a schematic view of parts of layers of an exemplary PCB, showing certain components including traces of the PCB.

Referring to FIGS. 1 and 2, an exemplary embodiment of an automatic system 10 is disclosed for providing printed circuit board (PCB) layout for producing a PCB capable of transmitting high-speed signals with little or no interference. The automatic system 10 includes an input device 100, a data processing device 200, and a storage device 300. In one embodiment, the input device 100 can be a keyboard or a mouse, etc., and the data processing device 200 can be a computer, a server, or a microprocessor, etc. The data processing device 200 includes an invoking module 202, a calculating module 204, a determining module 206, and an output module 208.

The input device 100 is to receive input information including a transmission bit rate, such as 6.4 Gb/s, of a high-speed signal to be transmitted in the PCB, and relative permittivity, such as 4.2, of the PCB. The input device 100 also transmits the transmission bit rate and the relative permittivity to the data processing device 200.

The storage device 300 includes a database which connects to the data processing device 200 via a connection. In one embodiment, the connection is a database connectivity, such as open database connectivity (ODBC) or java database connectivity (JDBC). The database is to store information of a plurality of PCBs. In one embodiment, information of the PCBs may include names or thicknesses of each layer of each PCB. For example, as shown in table 1, names, from a top layer to a bottom layer, of the PCB may be S1, C1 ... S2, and thicknesses, from the top layer to the bottom layer, may be 1 mil, 2.3 mil ... 1 mil.

TABLE 1

| Information of PCB | | | | | | | | | | | | | |
|---|---|---|---|---|---|---|---|---|---|---|---|---|
| Layer name | | | | | | | | | | | | | |
| | S1 | C1 | F1 | C2 | F2 | C3 | F3 | C4 | F4 | C5 | F5 | C6 | S2 |
| Thickness (mil) | 1 | 2.3 | 3.7 | 1.35 | 4 | 1.35 | 13 | 2.7 | 4 | 13 | 3.7 | 2.3 | 1 |

The invoking module 202 is to read the information of a corresponding PCB from the database of the storage device 300, according to the transmission bit rate of the high-speed signal and the relative permittivity of the PCB input through the input device 100.

The calculating module 204 is to calculate an actual length of a via stub of each layer of the PCB according to the information of the PCB. A via stub is a part of a through via and functions as a short transmission line for the high-speed signal, and can be a major factor in whether or not resonance reflection has an impact on signal integrity. The calculating module 204 also calculates an ideal length of the via stub of the PCB, according to a preset formula for reducing resonance reflection of the high-speed signal. In this embodiment, the actual length of the via stub of each layer equals the thickness of the PCB minus the thicknesses of high-speed signal layout layers through which a high-speed signal is transmitted of the PCB combined. For example, in a ten-layer PCB, an actual length of a via stub of a third layer equals the thickness of the fourth to tenth layers combined.

As shown in FIG. 2, if a high-speed signal is transmitted along a trace 24 via layers 20 and 22 through a through via 21 of a PCB, a thickness of high-speed signal layout layers that the high-speed signal passes through is L1, and an actual length of a via stub of the layer 22 is L2. As shown in table 1, the actual length of the via stub of the layer C5 is F5+C6+S2=3.7+2.3+1=7 mil. If a length of the via stub of a high-sp signal layout layer of the PCB is L, a method for calculating the ideal length $L_{MAX}$ of the via stub of the PCB is as follows. To reduce the resonance reflection during the high-speed signal being transmitted in the through via, the following formulas need to be satisfied $$L = \frac{1}{4}\lambda = \frac{C}{4\sqrt{\varepsilon_r} \times f_{res}} = \frac{2.95275}{\sqrt{\varepsilon_r} \times f_{res}} \text{ and } f_{res} \geq 10 \times f,$$

that is $$\frac{2.95275}{\sqrt{\varepsilon_r} \times L} \geq 10 \times \frac{BR}{2} = 5BR,$$

$$L \leq \frac{0.59055}{\sqrt{\varepsilon_r} \times BR},$$

$$L_{MAX} = \frac{0.59055}{\sqrt{\varepsilon_r} \times BR},$$

where λ is a wavelength of the high-speed signal, C is the high-speed signal transmission rate, which is taken to equal the speed of light (2.95275*10⁸ m/s), $\varepsilon_r$ is relative permittivity of the PCB, $f_{res}$ is a resonant frequency when the high-speed signal transmitted in the via stub, BR is a transmission bit rate of the high-speed signal transmitted in the PCB. For example, if BR=6 Gb/s, and $\varepsilon_r$=4, the ideal length $L_{MAX}$ of the via stub of the PCB equals to 49.2125 mil.

The determining module 206 is to compare the ideal length $L_{MAX}$ and the actual length of the via stub of each layer of the PCB. If the actual length is less than or equal to the ideal length $L_{MAX}$ of the via stub of the PCB, this layer can be used as a high-speed signal layout layer. If the actual length is greater than the ideal length $L_{MAX}$ of the via stub, this layer cannot be used as a high-speed signal layout layer.

The output module 208 is to send a result of a comparison between the actual length and the ideal length $L_{MAX}$ of the determining module 206 to the storage device 300, the result is stored in the database of the storage device 300.

Figure 3:
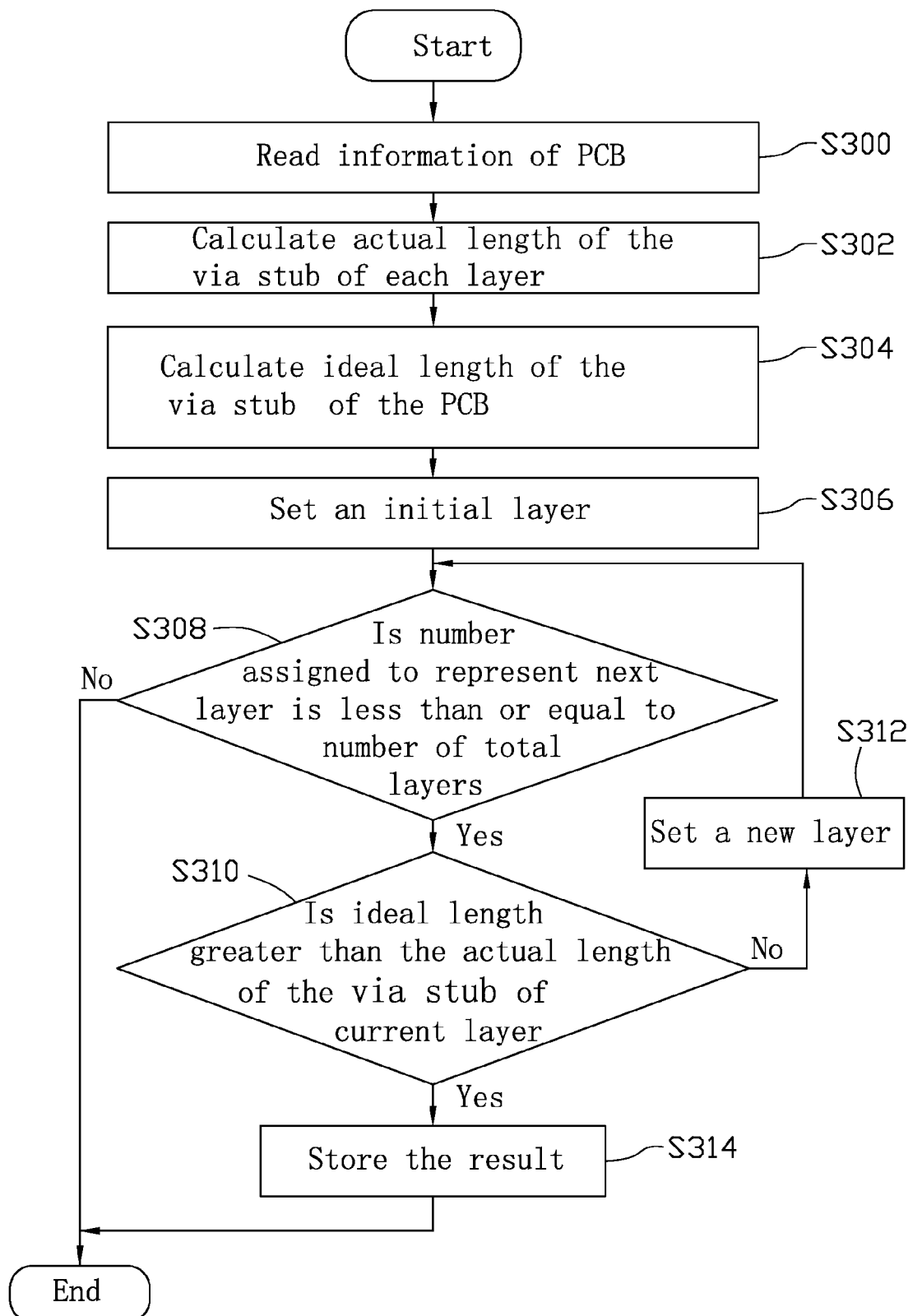
FIG. 3 is a flowchart of an exemplary embodiment of an automatic method for providing PCB layout.

Referring to FIG. 3, an exemplary embodiment of an automatic method using the above mentioned automatic system 10 for providing printed circuit board (PCB) layout for producing a PCB capable of transmitting high-speed signals with little or no interference includes the following steps.

In step S300, the invoking module 202 of the data processing device 200 reads the information of the PCB from the database of the storage device 300, according to a transmission bit rate of a high-speed signal and a relative permittivity of the PCB, input through the input device 100.

In step S302, the calculating module 204 calculates an actual length of a via stub of each layer according to the information of the PCB, the actual length of the via stub of each layer equals the thickness of the PCB minus the thicknesses of high-speed signal layout layers through which a high-speed signal is transmitted of the PCB combined.

In step S304, the calculating module 204 calculates an ideal length $L_{MAX}$ of the via stub of the PCB according to a preset formula $$L_{MAX} = \frac{0.59055}{\sqrt{\varepsilon_r} \times BR}$$

for reducing resonance reflection of the high-speed signal and the transmission bit rate of the high-speed signal and relative permittivity of the PCB, where $\varepsilon_r$ is the relative permittivity of the PCB, and BR is the transmission bit rate of the high-speed signal transmitted in the PCB.

In step S306, the determining module 206 sets an initial layer as a current layer, such as the first layer.

In step S308, the determining module 206 determines whether a number (e.g No. 1) assigned to represent the next layer to be checked is less than or equal to the number of total layers of the PCB, if the assigned number is less than or equal to the number of the total layers of the PCB, the procedure goes to step S310, if not, the procedure ends.

In step S310, the determining module 206 compares the ideal length $L_{MAX}$ and the actual length of the via stub of the current layer. If the ideal length $L_{MAX}$ is less than or equal to the actual length of the current layer, the current layer can not be used as a high-speed signal layout layer, the procedure goes to step S312. If the ideal length $L_{MAX}$ is greater than the actual length of the current layer, the current layer can be used as a high-speed signal layout layer, the procedure goes to step S314.

In step S312, the determining module 206 increments the assigned number by one and the procedure returns to step S308.

In step S314, the output module 206 sends a result of the comparison between the actual length and the ideal length $L_{MAX}$ of the determining module 206 to the storage device 300, to store the result in the database of the storage device 300.

The automatic system and method can not only automatically choose layout layers for the high-speed signal, but also reduce the resonance reflection of the high-speed signal transmission to ensure transmission quality of the high-speed signal.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. An automatic system for providing printed circuit board (PCB) layout of a PCB to be designed to allow a high-speed signal to be transmitted through, the system comprising:
   an input device to receive input information of the PCB to be designed;
   a storage device storing a name and a thickness of each layer of each of a plurality of PCBs; and
   a data processing device comprising:
   an invoking module to read the name and thickness of each layer of the PCB to be designed from the storage device, according to the input information from the input device;
   a calculating module to calculate an actual length of a via stub of each layer of the PCB to be designed, according to the name and thickness of each layer of the PCB to be designed stored in the storage device, and to calculate an ideal length $L_{MAX}$ of the via stub of the PCB according to the input information and a preset formula $$L_{MAX} = \frac{0.59055}{\sqrt{\varepsilon_r} \times BR}$$

for reducing resonance reflection of the high-speed signal, wherein $\varepsilon_r$ is relative permittivity of the PCB, and BR is a transmission bit rate of the high-speed signal transmitted in the PCB, the actual length of the via stub of each layer equals the thickness of the PCB minus the thicknesses of high-speed signal layout layers through which the high-speed signal is transmitted of the PCB combined; and a determining module to set an initial layer as a current layer and determine whether a number assigned to represent the next layer to be checked is less than or equal to the number of total layers of the PCB, and compare the ideal length and the actual length of the via stub of each layer in response to that the assigned number being less than or equal the number of total layers of the PCB, wherein a layer can be used as a high-speed signal layout layer in response to the actual length of the via stub of the layer being less than or equal to the ideal length of the via stub of the PCB, while a layer cannot be used as a high-speed signal layout layer in response to the actual length of the via stub of the layer is greater than the ideal length of the via stub of the PCB; and the determining module to increment the assigned number by one in response to that the current layer cannot be used as a high-speed signal layout layer.

2. The system of claim 1, wherein the data processing device further comprises an output module, wherein the output module is to send a result of a comparison between the actual length and the ideal length from the determining module to the storage device.

3. The system of claim 1, wherein the input device is a keyboard.

4. The system of claim 1, wherein the input device is a mouse.

5. The system of claim 1, wherein the data processing device is a computer.

6. The system of claim 1, wherein the data processing device is a microprocessor.

7. The system of claim 1, wherein the storage device comprises a database to store the information of the plurality of PCBs, the database is connected to the data processing device via a connection.

8. The system of claim 6, wherein the connection is open database connectivity.

9. The system of claim 6, wherein the connection is java database connectivity.

10. The system of claim 1, wherein the input information comprises a transmission bit rate of the high-speed signal transmitted in the PCB and a relative permittivity of the PCB.

11. An automatic method for providing printed circuit board (PCB) layout of a PCB to be designed to allow a high-speed signal to be transmitted through, the method comprising:

providing a storage device a database storing names and thicknesses of all layers of a plurality of PCBs;

reading a name and a thickness of each layer of the PCB from the database;

calculating an actual length of a via stub of each layer of the PCB according to the name and thickness, wherein the actual length of the via stub of each layer equals the thickness of the PCB minus the thicknesses of high-speed signal layout layers through which the high-speed signal is transmitted of the PCB combined;

calculating an ideal length $L_{MAX}$ of the via stub of the PCB according to input information from an input device and a preset formula $$L_{MAX} = \frac{0.59055}{\sqrt{\varepsilon_r} \times BR}$$

for reducing resonance reflection of the high-speed signal by a data processing device, where $\varepsilon_r$ is relative permittivity of the PCB, and BR is a transmission bit rate of the high-speed signal transmitted in the PCB;

setting an initial layer as a current layer;

determining whether a number assigned to represent the next layer to be checked is less than or equal to the number of total layers of the PCB, wherein if the assigned number is greater than the number of total layers of the PCB, the procedure ends; and comparing the ideal length $L_{MAX}$ of the via stub and the actual length of the via stub of the current layer in response to the number of the current layer being less than or equal to the number of total layers of the PCB by a data processing device; wherein the current layer cannot be used as a high-speed signal layout layer and the procedure ends in response to the actual length of the via stub of the current layer is greater than the ideal length $L_{MAX}$ of the PCB; wherein the current layer can be used as a high-speed signal layout layer in response to the actual length of the via stub of the current layer being less than or equal to the ideal length $L_{MAX}$ of the PCB; and incrementing the assigned number by one in response to that the current layer cannot be used as a high-speed signal layout layer, and the procedure returning to the step of determining whether a number assigned to represent the next layer to be checked is less than or equal to the number of total layers of the PCB.

* * * * *